United States Patent
Kim et al.

(10) Patent No.: US 10,137,533 B2
(45) Date of Patent: Nov. 27, 2018

(54) MULTI-FUNCTIONAL APPARATUS FOR TESTING AND ETCHING SUBSTRATE AND SUBSTRATE PROCESSING APPARATUS INCLUDING THE SAME

(71) Applicant: SAMSUNG DISPLAY CO., LTD., Yongin-si, Gyeonggi-do (KR)

(72) Inventors: Sung-Hwan Kim, Yongin-si (KR); Sang-Su Kim, Yongin-si (KR); Byoung-Seong Jeong, Yongin-si (KR); Je-Hyun Song, Yongin-si (KR); Tae-Hun Lee, Yongin-si (KR); Sung-Won Yang, Yongin-si (KR); Tae-Hyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 209 days.

(21) Appl. No.: 15/156,194

(22) Filed: May 16, 2016

(65) Prior Publication Data
US 2016/0256960 A1 Sep. 8, 2016

Related U.S. Application Data

(62) Division of application No. 13/902,698, filed on May 24, 2013.

(30) Foreign Application Priority Data

Dec. 27, 2012 (KR) ........................ 10-2012-0155324

(51) Int. Cl.
C03C 15/00 (2006.01)
B23K 26/70 (2014.01)
(Continued)

(52) U.S. Cl.
CPC ............ *B23K 26/70* (2015.10); *B23K 26/032* (2013.01); *B23K 26/083* (2013.01);
(Continued)

(58) Field of Classification Search
CPC ........... H01L 21/67069; H01L 21/2026; H01L 21/76894; B23K 26/032; B23K 26/083; B23K 26/0876
(Continued)

(56) References Cited

U.S. PATENT DOCUMENTS 6,730,550 B1 5/2004 Yamazaki et al.
6,995,035 B2 2/2006 Cok et al.
(Continued)

FOREIGN PATENT DOCUMENTS

CN 1284741 A 2/2001
CN 101206412 A 6/2008
(Continued)

OTHER PUBLICATIONS

TIPO Office Action dated Mar. 2, 2017, for corresponding Taiwanese Patent Application No. 102120098 (7 pages).

*Primary Examiner* — Binh X Tran
(74) *Attorney, Agent, or Firm* — Lewis Roca Rothgerber Christie LLP

(57) ABSTRACT

A multi-functional apparatus for testing and etching a substrate capable of increasing spatial efficiency and manufacturing efficiency by performing testing and etching operations in a same chamber body and a substrate processing apparatus including the same, the multi-functional apparatus including a chamber body having an entrance into which the substrate is injected in one of its sides and an exit from which the substrate is ejected in another one of its sides; a transfer unit disposed inside of the chamber body and for transferring the injected substrate in a direction from the
(Continued)

entrance to the exit; a laser etching unit disposed on an upper portion of the transfer unit and for etching a part of the substrate disposed on the transfer unit; and a testing unit for testing the substrate disposed on the transfer unit.

20 Claims, 8 Drawing Sheets

(51) Int. Cl.
| | |
|---|---|
| *H01L 21/768* | (2006.01) |
| *G09G 3/00* | (2006.01) |
| *B23K 26/03* | (2006.01) |
| *B23K 26/08* | (2014.01) |
| *B23K 26/12* | (2014.01) |
| *B23K 31/10* | (2006.01) |
| *H01L 21/67* | (2006.01) |
| *H01L 21/66* | (2006.01) |
| *H01L 51/56* | (2006.01) |
| *B23K 26/361* | (2014.01) |
| *B23K 103/00* | (2006.01) |
| *G09G 3/3208* | (2016.01) |

(52) U.S. Cl.
CPC ...... *B23K 26/0823* (2013.01); *B23K 26/0876* (2013.01); *B23K 26/123* (2013.01); *B23K 26/361* (2015.10); *B23K 31/10* (2013.01); *G09G 3/006* (2013.01); *H01L 21/67069* (2013.01); *H01L 21/76894* (2013.01); *H01L 22/12* (2013.01); *H01L 51/56* (2013.01); *B23K 2103/30* (2018.08); *B23K 2103/50* (2018.08); *B23K 2203/30* (2015.10); *B23K 2203/50* (2015.10); *G09G 3/3208* (2013.01)

(58) Field of Classification Search
USPC ...................................................... 216/65, 94
See application file for complete search history.

(56) References Cited

U.S. PATENT DOCUMENTS

| | | |
|---|---|---|
| 2003/0217809 A1 | 11/2003 | Morishige |
| 2006/0292311 A1 | 12/2006 | Kilburn et al. |
| 2007/0211323 A1 | 9/2007 | Jung et al. |
| 2008/0024773 A1* | 1/2008 | Miyazaki ............ G01N 21/4738 356/237.2 |
| 2009/0004405 A1 | 1/2009 | Merry et al. |
| 2009/0291610 A1 | 11/2009 | Sasaki |
| 2009/0317214 A1 | 12/2009 | Hsiao et al. |
| 2010/0282956 A1* | 11/2010 | Kimba .................... H01J 37/28 250/252.1 |
| 2011/0012258 A1* | 1/2011 | Omandam ......... B23K 26/0042 257/737 |
| 2011/0052791 A1 | 3/2011 | Jo et al. |
| 2013/0015166 A1* | 1/2013 | Li ........................ B23K 26/032 219/121.67 |
| 2013/0068368 A1 | 3/2013 | Kim et al. |
| 2013/0156879 A1* | 6/2013 | Lee ....................... B29C 59/026 425/385 |
| 2013/0199445 A1 | 8/2013 | Sonoda et al. |
| 2014/0138032 A1* | 5/2014 | Kweon ................. B32B 43/006 156/712 |
| 2014/0253160 A1* | 9/2014 | Brunner ................. G09G 3/006 324/750.25 |

FOREIGN PATENT DOCUMENTS

| | | |
|---|---|---|
| CN | 101338414 A | 1/2009 |
| CN | 101675178 A | 3/2010 |
| CN | 102005541 A | 4/2011 |
| CN | 102169815 A | 8/2011 |
| KR | 10-2006-0061083 A | 6/2006 |
| KR | 10-2008-0062212 A | 7/2008 |
| KR | 10-2013-0030098 A | 3/2013 |
| TW | 200403520 | 3/2004 |
| TW | 200714374 | 4/2007 |
| TW | 200739995 | 10/2007 |
| TW | 201001599 A1 | 1/2010 |
| WO | WO 2012/053402 A1 | 4/2012 |

* cited by examiner

MULTI-FUNCTIONAL APPARATUS FOR TESTING AND ETCHING SUBSTRATE AND SUBSTRATE PROCESSING APPARATUS INCLUDING THE SAME

CROSS-REFERENCE TO RELATED PATENT APPLICATION

This application is a divisional of U.S. patent application Ser. No. 13/902,698, filed on May 24, 2013, now abandoned, which claims priority to and the benefit of Korean Patent Application No. 10-2012-0155324, filed on Dec. 27, 2012, in the Korean Intellectual Property Office, the disclosures of both of which are incorporated herein in their entireties by reference.

BACKGROUND

1. Field

Aspects of embodiments of the present invention relate to a multi-functional apparatus for testing and etching a substrate and a substrate processing apparatus including the same.

2. Description of the Related Art

In general, a comparable process for manufacturing an organic light-emitting display apparatus sequentially includes a first deposition operation of forming an organic material including an emission layer, a second deposition operation of forming an electrode on the organic material, an etching operation of removing an unnecessarily deposited material, an operation of forming an encapsulation layer to protect an organic light-emitting device (OLED) from external impurities, and an operation of testing performance of the manufactured organic light-emitting display apparatus.

However, such a comparable process for manufacturing the organic light-emitting display apparatus problematically has low spatial efficiency because units for performing the above operations occupy large spaces.

In addition, according to the comparable process for manufacturing the organic light-emitting display apparatus, even though a defective organic light-emitting display apparatus is manufactured due to a misalignment during the manufacturing process such as the deposition operations, such a defect is checked during the testing operation after the operation of forming the encapsulation layer.

Thus, even though the manufacturing process is stopped for a specific panel to check a defect of the specific panel (substrate) during the testing operation, subsequent panels (substrates) are still being manufactured by the deposition operations that may be defective and are not stopped until the defect of the panel (substrate) is checked, which problematically causes low manufacturing efficiency.

SUMMARY

In order to address the drawback of the comparable process for manufacturing the organic light-emitting display apparatus and/or other issues, aspects of embodiments of the present invention are directed toward multi-functional apparatuses for testing and etching a substrate capable of increasing spatial efficiency and manufacturing efficiency by performing testing and etching operations in a same chamber body and substrate processing apparatuses including the same.

According to an embodiment of the present invention, there is provided a multi-functional apparatus for testing and etching a substrate, the multi-functional apparatus including: a chamber body having an entrance in one of its sides and an exit in another one of its sides, the substrate being injected into the chamber body through the entrance and being ejected from the chamber body through the exit; a transfer unit disposed inside of the chamber body and configured to transfer the injected substrate in a direction from the entrance to the exit; a laser etching unit disposed above the transfer unit and configured to etch a part of the substrate disposed on the transfer unit; and a testing unit configured to test the substrate disposed on the transfer unit.

The testing unit may be disposed under the transfer unit.

The chamber body may have a lower opening in a lower portion thereof. The multi-functional apparatus may further include an up-down unit for moving the testing unit up and down, wherein the testing unit is moved up by the up-down unit to be disposed adjacent to the lower opening of the chamber body, and tests the substrate. In one embodiment, when the testing unit is moved up by the up-down unit, the testing unit shields the lower opening of the chamber body.

The multi-functional apparatus may further include an up-down unit for moving the testing unit up and down through the lower opening in such a manner that the testing unit is disposed inside or outside of the chamber body. The testing unit may be moved up by the up-down unit to be disposed inside of the chamber body, and tests the substrate.

The testing unit may include a plate in which a plurality of holes are formed and testing devices engaged into at least a part of the plurality of holes. The testing devices may be detachably engaged into at least a part of the plurality of holes.

The multi-functional apparatus may further include a rotation unit for rotating the substrate disposed on the transfer unit to face a side surface of the chamber body, wherein the testing unit is disposed next to the transfer unit and tests the rotated substrate.

The laser etching unit may include: a laser beam irradiation unit for irradiating a laser beam onto the substrate; a first conveyer unit for conveying the laser beam irradiation unit in the direction from the entrance to the exit or in an opposite direction to the direction; and a second conveyer unit for conveying the laser beam irradiation unit in a direction crossing the direction from the entrance to the exit. One of the first conveyer unit and the second conveyer unit may be conveyed by the other one, along with the laser beam irradiation unit.

The laser etching unit may include: a laser beam irradiation unit for irradiating a laser beam onto the substrate; a guiding unit configured to guide the laser beam ejected from the laser beam irradiation unit onto the substrate; a first conveyer unit for conveying the guiding unit in the direction from the entrance to the exit or in an opposite direction to the direction; and a second conveyer unit for conveying the guiding unit in a direction crossing the direction from the entrance to the exit. One of the first conveyer unit and the second conveyer unit may be conveyed by the other one, along with the guiding unit. A relative location of the laser beam irradiation unit with respect to the chamber body may be fixed.

The multi-functional apparatus may further include an etching unit support unit configured to support the laser etching unit from the outside of the chamber body, wherein the chamber body has an upper opening formed in an upper portion thereof and includes a transmission window that shields the upper opening, and wherein the laser beam irradiation unit irradiates the laser beam onto the substrate through the transmission window. The etching unit support unit may be configured not to contact the chamber body.

The inside of the chamber body may be maintained in a nitrogen atmosphere.

The multi-functional apparatus for testing and etching the substrate may be configured to manufacture a bottom emission display apparatus. The transfer unit may contact and transfer the substrate through which light is to pass, and the substrate is an element of the bottom emission display apparatus.

According to another embodiment of the present invention, there is provided a substrate processing apparatus including: a first process chamber; a second process chamber; and the multi-functional apparatus for testing and etching the substrate disposed between the first process chamber and the second process chamber.

The substrate processing apparatus may further include: a first chamber support unit for supporting the first process chamber; and a second chamber support unit for supporting the second process chamber, wherein the multi-functional apparatus for testing and etching the substrate is supported by the first chamber support unit and the second chamber support unit.

The first process chamber may be a deposition chamber or a plasma etching chamber.

The second process chamber may be an encapsulation chamber.

The substrate processing apparatus may be configured to manufacture a bottom emission display apparatus. The transfer unit of the multi-functional apparatus for testing and etching the substrate may contact and transfer the substrate through which light is to pass, and the substrate is an element of the bottom emission display apparatus.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
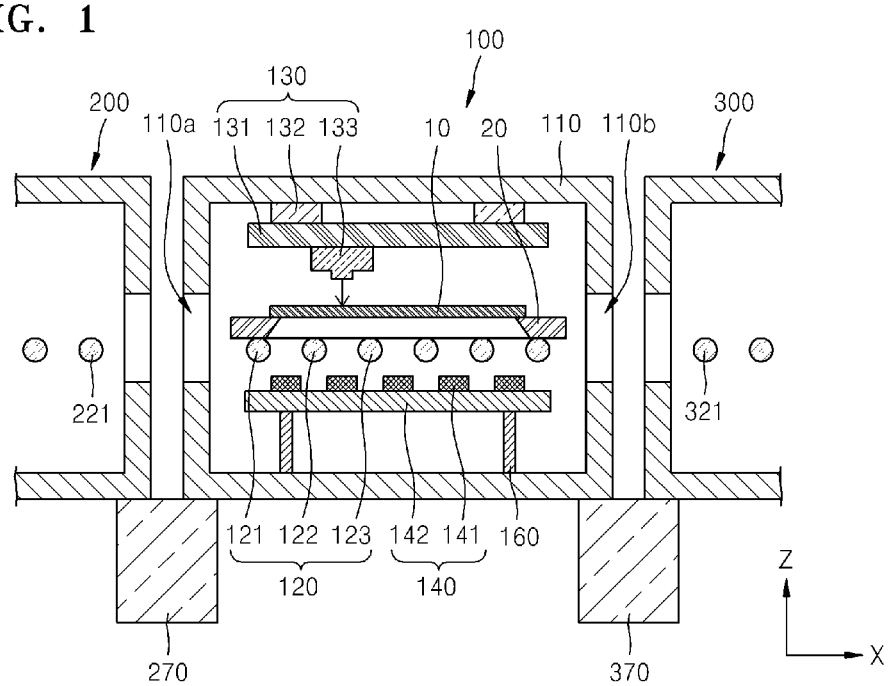
FIG. 1 is a schematic cross-sectional view illustrating a multi-functional apparatus for testing and etching a substrate according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. In the drawings, sizes of elements may be exaggerated or reduced for convenience of description.

In the embodiments below, x, y, and z axes are not limited to three axes on an orthogonal coordinate system and may be interpreted to be any three suitable axes. For example, the x, y, and z axes may be orthogonal to each other or may be referred to different directions that are not orthogonal to each other.

Also, the sizes and thicknesses of elements in the drawings are schematically shown for convenience of description but the present invention is not limited thereto.

Moreover, in the drawings, the thicknesses of layers and regions are exaggerated or reduced for clarity and/or for convenience of description. It will be understood that when an element (such as a layer, a film, a region, a plate, etc.) is referred to as being "on" another element, the element may be directly on the other element or one or more intervening elements may be interposed therebetween.

Figure 2:
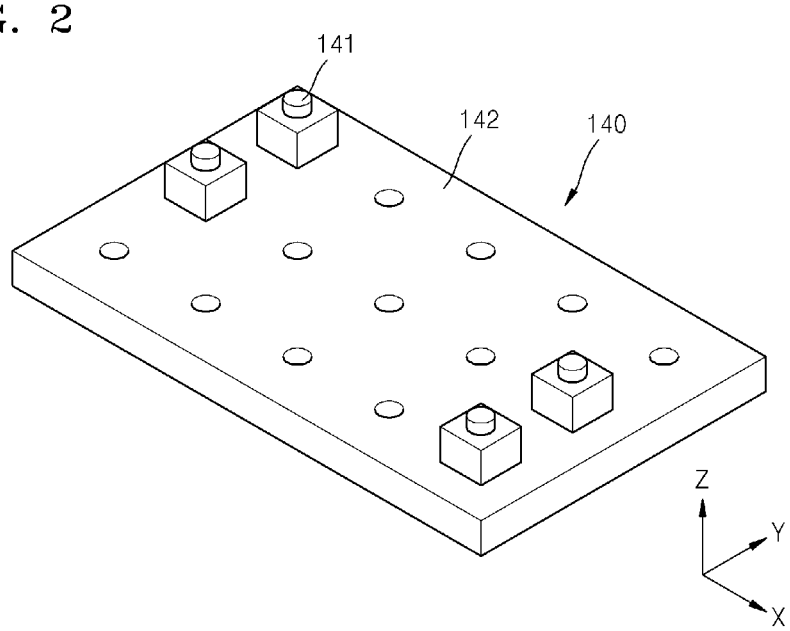
FIG. 2 is a schematic perspective view of a testing unit of the multi-functional apparatus for testing and etching the substrate of FIG. 1, according to an embodiment of the present invention.
Figure 3:
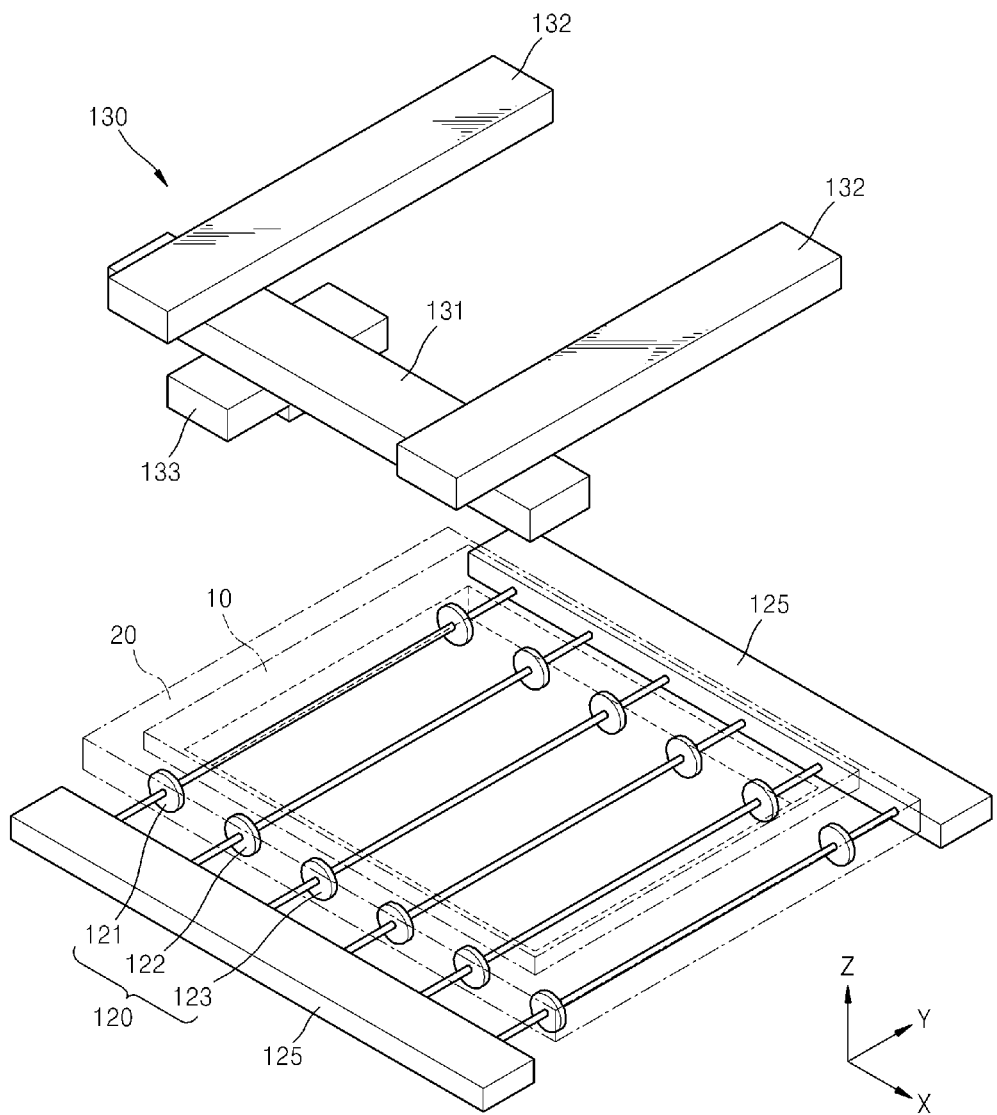
FIG. 3 is a schematic perspective view of a laser etching unit and a transfer unit of the multi-functional apparatus for testing and etching the substrate of FIG. 1, according to an embodiment of the present invention.

FIG. 1 is a schematic cross-sectional view illustrating a multi-functional apparatus 100 for testing and etching a substrate 10 according to an embodiment of the present invention. FIG. 2 is a schematic perspective view of a testing unit 140 of the multi-functional apparatus 100 for testing and etching the substrate 10 of FIG. 1, according to an embodiment of the present invention. FIG. 3 is a schematic perspective view of a laser etching unit 130 and a transfer unit 120 of the multi-functional apparatus 100 for testing and etching the substrate 10 of FIG. 1, according to an embodiment of the present invention.

The multi-functional apparatus 100 for testing and etching the substrate according to the present embodiment includes a chamber body 110, the transfer unit 120, the laser etching unit 130, and the testing unit 140.

The chamber body 110 may form an overall appearance of the multi-functional apparatus 100 for testing and etching the substrate 10 according to the present embodiment. The chamber body 110 has an entrance 110a in one of its sides (−x direction) and an exit 110b in another one of its sides (+x direction). The substrate 10 may be injected into the chamber body 110 through the entrance 110a and ejected from the chamber body 110 through the exit 110b. In this regard, the substrate 10 may be a simple substrate or may be a substrate on which a thin film transistor (TFT), a pixel electrode, an intermediate layer including an emission layer, and an opposite electrode are formed. This will apply to the embodiments and modifications thereof that will be described later.

The chamber body 110 may shield the inside of the chamber body 110 from the outside to prevent the inside from being influenced by the outside. The inner part of the chamber body 110 may be maintained in a nitrogen atmosphere so as to prevent the substrate 10 that is etched or tested from being influenced by impurities. To this end, a fuzzy line (not shown) that supplies nitrogen may be connected to the chamber body 110.

The multi-functional apparatus 100 for testing and etching the substrate 10 may be used for a process for manufacturing an organic light-emitting display apparatus. For example, the multi-functional apparatus 100 for testing and etching the substrate 10 may be disposed between a first process chamber 200 and a second process chamber 300. In this regard, the first process chamber 200 may be, for example, a plasma etching chamber or a deposition chamber. The second process chamber 300 may be, for example, an encapsulation chamber. This will be described later in more detail.

The first process chamber 200 may be supported by a first chamber support unit 270. The second process chamber 300 may be supported by a second chamber support unit 370. In this case, the chamber body 110 of the multi-functional apparatus 100 for testing and etching the substrate 10 may be supported by the first chamber support unit 270 and the second chamber support unit 370. Differently from this, an additional support unit may be used to support the chamber body 110. However, a space is secured in a lower portion (−z direction) of the chamber body 110 by allowing the chamber body 110 of the multi-functional apparatus 100 for testing and etching the substrate 10 to be supported by the first chamber support unit 270 and the second chamber support unit 370, and thus the space may be utilized for various suitable applications. The first chamber support unit 270 may be integrated with or separated from the chamber body 110. The second chamber support unit 370 may also be integrated with or separated from the chamber body 110.

The transfer unit 120 may be disposed in the chamber body 110 and may transfer the injected substrate 10 from the entrance 110*a* to the exit 110*b* (+x direction). Such a transfer unit 120 may have various suitable shapes. The substrate 10 may be transferred by rotating a plurality of wheels 121, 122, and 123. In one embodiment, the substrate 10 may be transferred by being directly in contact to the wheels 121, 122, and 123. The substrate 10 may be transferred by fixing the substrate 10 onto a carrier 20 by using a clamp (not shown) and contacting the carrier 20 to the wheels 121, 122, and 123. In the latter, the carrier 20 may have an opening portion in a center part thereof to allow the testing unit 140 to test the substrate 10 as will be described later in more detail.

Although the transfer unit 120 includes the wheels 121, 122, and 123 and a fixed transfer frame 125 (referring to FIG. 3) configured to rotate the wheels 121, 122, and 123 in FIGS. 1 through 3, the present invention is not limited thereto. For example, the transfer unit 120 may have a structure of two parallel conveyor belts that extend in a transfer direction (+x direction) and are spaced apart from each other in a direction (+y direction) crossing the transfer direction.

Figure 4:
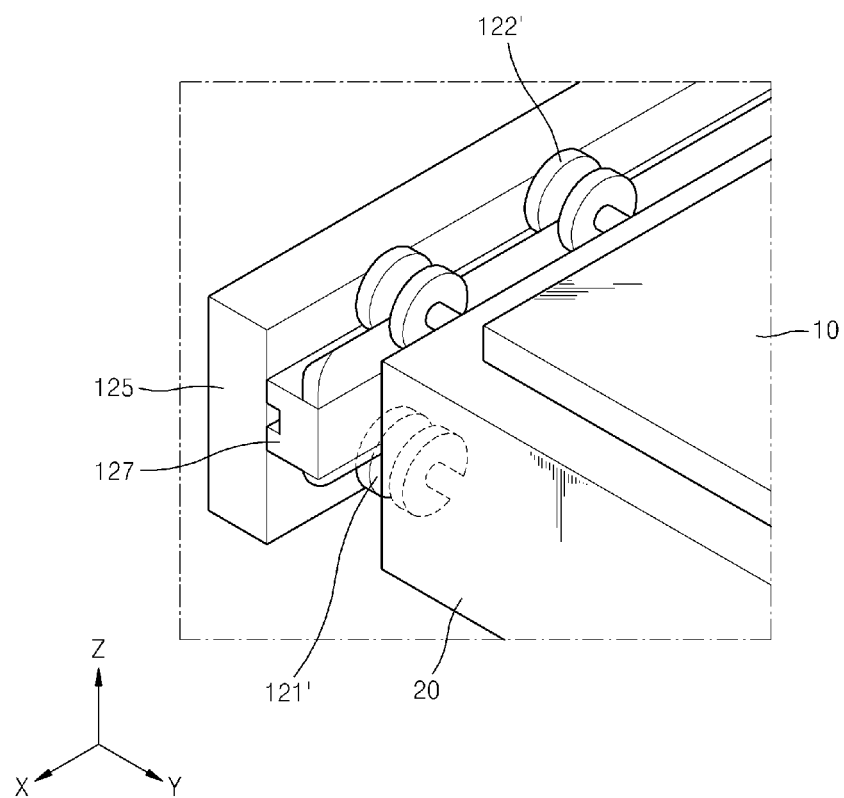
FIG. 4 is a schematic perspective view of a modification of the transfer unit of the multi-functional apparatus for testing and etching the substrate of FIG. 1, according to an embodiment of the present invention.

Also, as shown in FIG. 4 (a schematic perspective view of a modification of the transfer unit 120), a transfer unit may not include a wheel but may extend in the transfer direction (+x direction) and include rails 127 fixed to the transfer frame 125 or the chamber body 110. In this case, the carrier 20 in which the substrate 10 is seated includes wheels 121' and 122' so that the carrier 20 is transferred on the rails 127.

In this regard, the transfer unit may include the rails 127 that extend in the transfer direction (+x direction) and are spaced apart from each other in the direction (+y direction) crossing the transfer direction (+x direction) (FIG. 4 shows only one of the rails 127), and the carrier 20 in which the substrate 10 is seated may include the wheels 121' and 122' that are rotatably fixed to a side surface of the carrier 20 in a direction of the rails 127 and spaced apart from each other up and down (z axial direction). In this case, the rails 127 are disposed between the wheels 121' and 122' spaced apart from each other up and down in the side surface of the carrier 20 so that rotation directions of the lower and upper wheels 121' and 122' are opposite to each other, and thus the carrier 20 may be transferred on the rails 127.

The laser etching unit 130 may be disposed above the transfer unit 120 (+z direction). The laser etching unit 130 may etch a previously set part of the substrate 10 disposed on the transfer unit 120 by irradiating the laser beam onto the previously set part. In this regard, the etched part may be, for example, a part of a layer formed of organic and inorganic materials formed on a substrate. As described above, if deposition is performed in the first process chamber 200 with wheels 221 and then the substrate 10 is injected into the multi-functional apparatus 100 for testing and etching the substrate 10, the laser beam may be irradiated onto a specific region of a material layer deposited in the first process chamber 200 so as to remove the irradiated region.

The plasma etching chamber 300 with wheels 321 is suitably used during the manufacturing process to remove a portion of a deposited layer. Here, in the case of an embodiment, it is necessary to shield a part that should not be removed by using a mask. Accordingly, if a specification of the organic light-emitting display apparatus that is to be manufactured and the manufacturing process thereof changes, it is inconvenient to change the shielding mask. However, the multi-functional apparatus 100 for testing and etching the substrate 10 according to the present embodiment selects a part to be removed and irradiates the laser beam onto the selected part, thereby dramatically increasing manufacturing efficiency.

In particular, to this end, the laser etching unit 130 may include a first conveyer unit 131 and a second conveyer unit 132 in addition to a laser beam irradiation unit 133. In addition, for example, one of the first conveyer unit 131 and the second conveyer unit 132 may be conveyed by the other one, along with the laser beam irradiation unit 133.

The laser beam irradiation unit 133 is an element that finally emits a laser beam onto the substrate 10. The first conveyer unit 131 may convey the laser beam irradiation unit 133 in a direction (+x direction) from the entrance 110*a* of the chamber body 110 to the exit 110*b* or in the opposite direction (−x direction) to the direction (+x direction). The first conveyer unit 131 may be implemented in various suitable ways. For example, the first conveyer unit 131 may include a rotation axis that extends in the direction (+x direction) from the entrance 110*a* of the chamber body 110 to the exit 110*b* and has a thread on a circumferential surface thereof and a motor that rotates the rotation axis in a forward direction or in a backward direction. In this case, the laser beam irradiation unit 133 includes a through hole into which the rotation axis passes and a thread in an inner surface thereof so that the rotation axis rotates in the forward direction or in the backward direction by the motor, and thus the laser beam irradiation unit 133 may be conveyed in the direction (+x direction) in which the rotation axis extends or in the opposite direction (−x direction) to the direction in which the rotation axis extends.

The second conveyer unit 132 may convey the laser beam irradiation unit 133 in a direction (+y direction or −y direction) across the direction (+x direction) from the entrance 110a of the chamber body 110 to the exit 110b. This may result in a conveyance of the laser beam irradiation unit 133 disposed on the first conveyer unit 131 because the second conveyer unit 132 conveys the first conveyer unit 131 in the direction (+y direction or −y direction) across the direction (+x direction) from the entrance 110a of the chamber body 110 to the exit 110b. The second conveyer unit 132 may also be implemented in various suitable ways. As described in an exemplary construction of the first conveyer unit 131, the second conveyer unit 132 may also include a rotation axis having a thread on a circumferential surface thereof and a motor that rotates the rotation axis. In this case, a through hole into which the rotation axis of the second conveyer unit 312 passes and having a thread in an inner surface thereof may be formed in the first conveyer unit 131.

As described above, since the laser etching unit 130 may easily change and control a location of the laser beam irradiation unit 133 from the outside without opening the chamber body 110, even though a specification of the organic light-emitting display apparatus that is to be manufactured and the manufacturing process thereof changes, this problem may be quickly handled.

Also, although a case of performing deposition in the first process chamber 200 and then injecting the substrate 10 into the multi-functional apparatus 100 for testing and etching the substrate 10 is described up to now, the present invention is not limited thereto. For example, the first process chamber 200 may be a plasma etching chamber that etches a deposition material deposited on an unnecessary part by using plasma after performing deposition on the substrate 10 prior to the first process chamber 200. Thereafter, the plasma etching chamber roughly removes the deposition material deposited on the unnecessary part, then the substrate 10 is injected into the chamber body 110 of the multi-functional apparatus 100 for testing and etching the substrate 10 according to the present embodiment, and the laser etching unit 130 may additionally remove the deposition material deposited on the unnecessary part precisely.

The testing unit 140 may test the substrate 10 disposed on the transfer unit 120. More specifically, the testing unit 140 may be disposed under (−z direction) the transfer unit 120 and test the substrate 10 disposed on the transfer unit 120. Such a testing unit 140 may include a plate 142 in which a plurality of holes are formed and a testing device 141 engaged into at least a part of the plurality of holes as shown in FIG. 2. In this regard, the testing devices 141 may be detachably engaged into at least a part of the plurality of holes. Accordingly, when it is necessary to change locations of the testing devices 141 or exchange the testing devices 141, the locations may be easily changed or the testing devices 141 may be easily exchanged.

The testing devices 141 may be, for example, microscopes or cameras to test whether the organic light-emitting display apparatus that is being manufactured has a defective pixel or a brightness that is uniform in the entire surface. Testing results may be directly fed back to the first process chamber 200, thereby contributing to an increase in a manufacturing yield.

The testing unit 140 is disposed under (−z direction) the transfer unit 120 and tests the substrate 10 (an apparatus such as the organic light-emitting display apparatus that is being manufactured) disposed on the transfer unit 120. Thus, the apparatus such as the organic light-emitting display apparatus that is being manufactured may be a bottom emission display apparatus that emits light through the substrate 10 to the lower portion in which the testing unit 140 is disposed.

The transfer unit 120 may transfer the substrate 10 that is fixed onto the carrier 20 by using a clamp (not shown). In this case, the transfer unit 120 may contact the carrier 20. On the other hand, the transfer unit 129 may transfer the substrate 10 without the carrier 20 by directly contacting the substrate 10, through which light is to pass as the substrate 10 is an element of the bottom emission display apparatus.

In the multi-functional apparatus 100 for testing and etching the substrate 10 according to the present embodiment, an upper portion thereof performs etching to remove an unnecessary part on the substrate 10, and a lower portion thereof tests the substrate 10, thereby dramatically increasing spatial efficiency unlike a manufacturing facility such as the conventional organic light-emitting display apparatus that separately uses or needs an etching chamber and a testing chamber and thus requires a huge space.

Also, the multi-functional apparatus 100 for testing and etching the substrate 10 may be disposed between the first process chamber 200 that is the deposition chamber or the plasma etching chamber and the second process chamber 300 that is the encapsulation chamber.

A comparable apparatus for manufacturing an organic light-emitting display apparatus includes a first deposition chamber that forms an organic material including an emission layer, a second deposition chamber that forms an electrode on the organic material, an etching chamber that removes an unnecessarily deposited material, an encapsulation layer forming chamber that protects the OLED from external impurities, and a testing chamber that tests performance of the manufactured organic light-emitting display apparatus, and manufactures the organic light-emitting display apparatus by sequentially transferring a substrate through the above chambers. Thus, even though a defective organic light-emitting display apparatus is manufactured due to a misalignment during the manufacturing process such as deposition, such a defect may be checked in the testing chamber after the encapsulation layer forming chamber. As a result, even though the manufacturing process for a specific panel (substrate) is stopped by checking a defect of the specific panel (substrate) in the testing chamber, subsequent panels (substrates) are still being manufactured in the first and second deposition chambers that may be defective and are not stopped until the defect of the panel (substrate) is checked, which problematically causes low manufacturing efficiency.

The multi-functional apparatus 100 for testing and etching the substrate 10 according to the present embodiment may be disposed between the first process chamber 200 that is the deposition chamber or the plasma etching chamber and the second process chamber 300 that is the encapsulation chamber. As such, an unnecessarily deposited material that needs to be removed from the substrate 10 can be removed (etched away) before an encapsulation layer is formed in the encapsulation chamber.

Accordingly, testing is made before an encapsulation layer forming operation. That is, the testing unit 140 checks the defective organic light-emitting display apparatus that is manufactured due to a misalignment during the manufacturing process right before the encapsulation layer forming operation. Thus, if multi-functional apparatus 100 for testing and etching the substrate 10 checks a defect of a specific panel (substrate) and stops the manufacturing process, even though subsequent panels (substrates) are already continuously injected into deposition chambers until the defect of the panel (substrate) is checked, the number of the previously injected panels (substrates) may be dramatically reduced. This may produce effects of an enhancement of the manufacturing yield and a reduction in the manufacturing cost.

Figure 5:
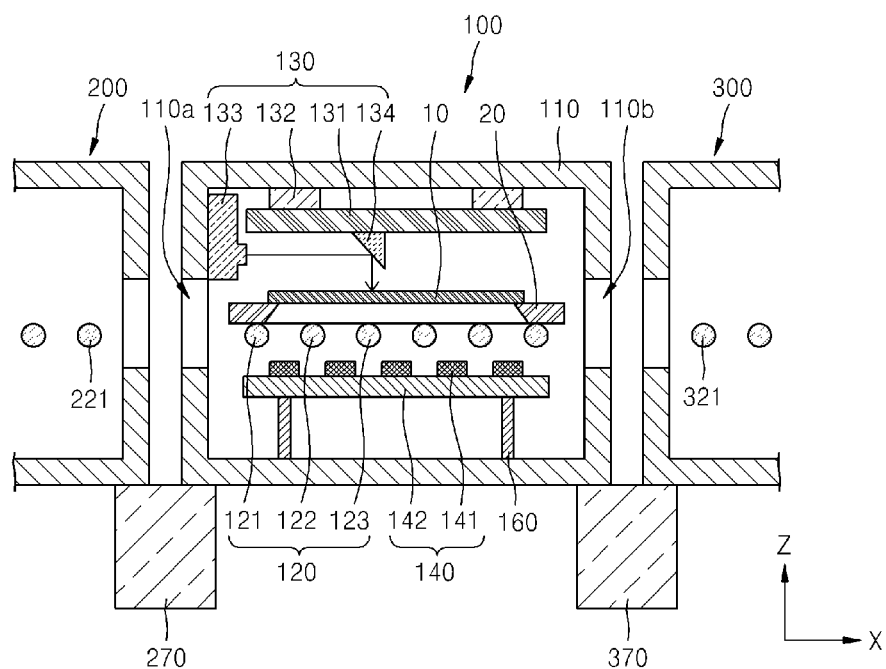
FIG. 5 is a schematic cross-sectional view illustrating a multi-functional apparatus for testing and etching a substrate according to another embodiment of the present invention.

FIG. 5 is a schematic cross-sectional view illustrating the multi-functional apparatus 100 for testing and etching the substrate 10 according to another embodiment of the present invention. The multi-functional apparatus 100 for testing and etching the substrate 10 according to the present embodiment is different from the multi-functional apparatus 100 for testing and etching the substrate 10 according to the previous embodiment in terms of the laser etching unit 130. The laser etching unit 130 of the multi-functional apparatus 100 for testing and etching the substrate 10 according to the present embodiment includes a guiding unit 134 in addition to the laser beam irradiation unit 133, the first conveyer unit 131, and the second conveyer unit 132.

The laser beam irradiation unit 133 may emit a laser beam but not directly emit the laser beam onto the substrate 10. The guiding unit 134 may instead guide the laser beam emitted from the laser beam irradiation unit 133 onto the substrate 10. Such a guiding unit 134 may include, for example, an obliquely inclined reflection surface.

The first conveyer unit 131 and the second conveyer unit 132 may convey the guiding unit 134. More specifically, the first conveyer unit 131 may convey the guiding unit 134 in a direction (+x direction) from the entrance 110a to the exit 110b or in the opposite direction (−x direction) to the direction (+x direction), and the second conveyer unit 132 may convey the guiding unit 134 in a direction (+y direction or −y direction) across the direction (+x direction) from the entrance 110a to the exit 110b. One of the first conveyer unit 131 and the second conveyer unit 132 may be conveyed by the other one, along with the guiding unit 134. In FIG. 5, the first conveyer unit 131 and the guiding unit 134 may be conveyed by the second conveyer unit 132.

A deposition operation may be performed in the first process chamber 200 or an encapsulation operation may be performed in the second process chamber 300. Such operations performed in adjacent chambers need very high precision, and thus it is necessary to minimize an occurrence of vibration. Accordingly, when a location of the laser beam irradiation unit 133 is changed in order to remove a material unnecessarily deposited on the substrate 10, this may cause an excessive vibration and have a bad influence on adjacent chambers.

However, in the multi-functional apparatus 100 for testing and etching the substrate 10 according to the present embodiment, the laser beam irradiation unit 133 is not conveyed by the first conveyer unit 131 or the second conveyer unit 132 but the guiding unit 134 is conveyed. Accordingly, a size or weight of an element conveyed by the first conveyer unit 131 or the second conveyer unit 132 is reduced or minimized, and thus vibration that may occur during the conveyance process may be reduced or minimized. In particular, a relative location of the laser beam irradiation unit 133 with respect to the chamber body 110 is fixed, thereby minimizing the occurrence of the vibration.

Figure 6:
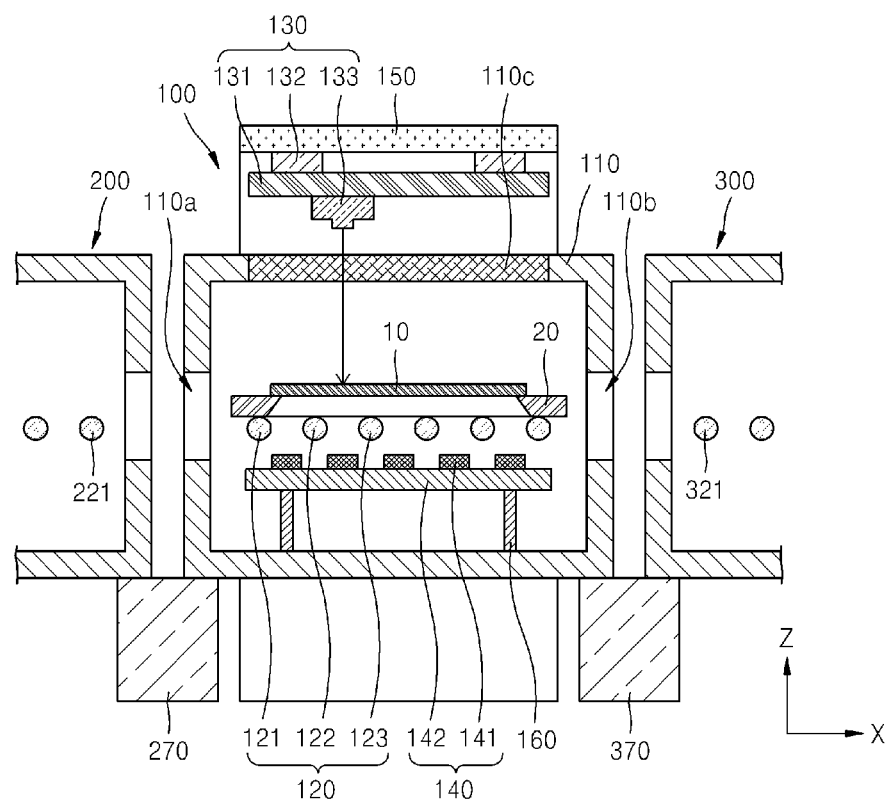
FIG. 6 is a schematic cross-sectional view illustrating a multi-functional apparatus for testing and etching a substrate according to another embodiment of the present invention.
Figure 7:
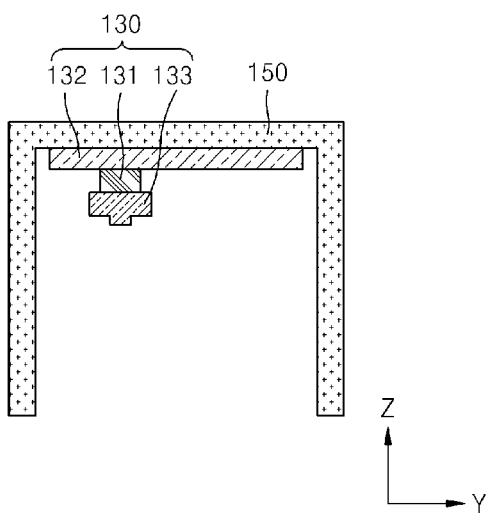
FIG. 7 is a schematic perspective view of a laser etching unit of the multi-functional apparatus for testing and etching the substrate of FIG. 6, according to an embodiment of the present invention.

FIG. 6 is a schematic cross-sectional view illustrating the multi-functional apparatus 100 for testing and etching the substrate 10 according to another embodiment of the present invention. FIG. 7 is a schematic perspective view of the laser etching unit 130 of the multi-functional apparatus 100 for testing and etching the substrate 10 of FIG. 6, according to an embodiment of the present invention. The multi-functional apparatus 100 for testing and etching the substrate 10 according to the present embodiment further includes an etching unit support unit 150 that supports the laser etching unit 130 from the outside of the chamber body 110. The etching unit support unit 150 may not contact the chamber body 110.

The laser etching unit 130 is disposed outside the chamber body 110. In addition, the chamber body 110 has an upper opening formed in an upper portion thereof and a transmission window 110c that shields the upper opening. Accordingly, the laser beam irradiation unit 133 may emit a laser beam onto the substrate 10 through the transmission window 110c.

In the multi-functional apparatus 100 for testing and etching the substrate 10 according to the present embodiment, although a location of the laser beam irradiation unit 133 is moved, since the etching unit support unit 150 that supports the laser etching unit 130 does not contact the chamber body 110, vibration that may occur during an operation of moving the location of the laser beam irradiation unit 133 may not be transferred to the chamber body 110.

As a modification of the multi-functional apparatus 100 for testing and etching the substrate 10 according to the present embodiment, the laser beam irradiation unit 133 may be supported by a first support unit at the outside of the chamber body 110 and the guiding unit 134 may also be supported by a second support unit of the outside of the chamber body 11, and thus the multi-functional apparatus 100 for testing and etching the substrate 10 according to the present embodiment may be modified in various ways.

Figure 8:
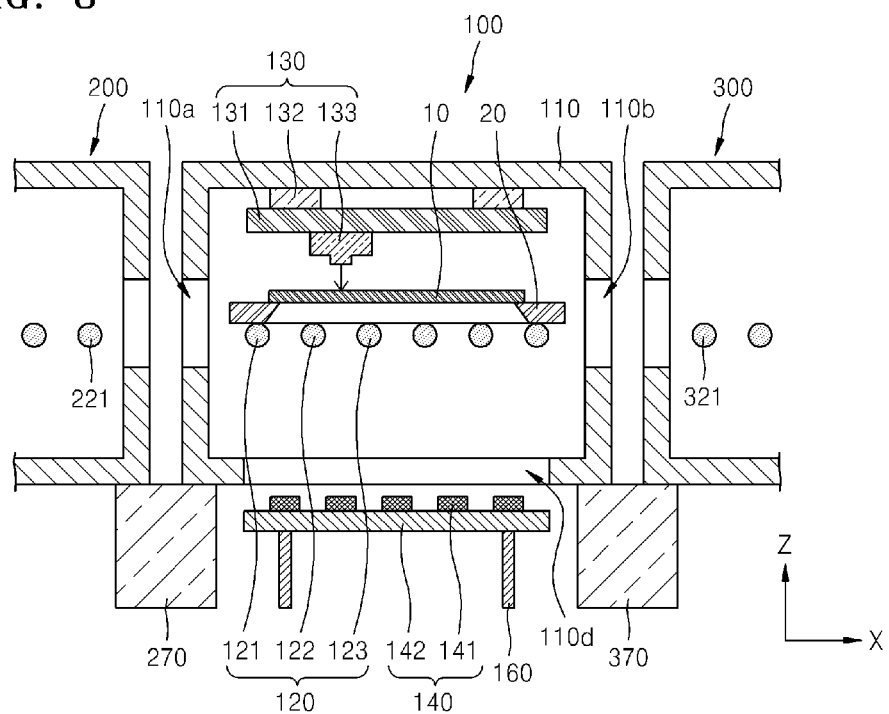
FIG. 8 is a schematic cross-sectional view illustrating a multi-functional apparatus for testing and etching a substrate according to another embodiment of the present invention.

FIG. 8 is a schematic cross-sectional view illustrating the multi-functional apparatus 100 for testing and etching the substrate 10 according to another embodiment of the present invention.

In the multi-functional apparatus 100 for testing and etching the substrate 10 according to the present embodiment, the chamber body 110 has a lower opening 110d in a lower portion thereof. The chamber body 110 further includes an up-down unit 160 that moves the testing unit 140 up and down (+z direction or −z direction). Accordingly, if the testing unit 140 is moved up in the +z direction by the up-down unit 160, the testing unit 140 that is adjacent to the lower opening 110d of the chamber body 110 may test the substrate 10. If the testing unit 140 is moved up in the +z direction by the up-down unit 160, the lower opening 110d of the chamber body 110 may be shielded by the testing unit 140.

In the multi-functional apparatus 100 for testing and etching the substrate 10 according to the present embodiment, when it is necessary to exchange a testing device 141 of the testing unit 140 or adjust a location of the testing device 141, the testing device 141 may be exchanged or the location thereof may be adjusted by moving the testing unit 140 down by the up-down unit 160, and the substrate 10 may be tested by moving the testing unit 140 up by the up-down unit 160.

In particular, the chamber body 110 of the multi-functional apparatus 100 for testing and etching the substrate 10 may be supported by the first chamber support unit 270 and the second chamber support unit 370 when the first process chamber 200 is supported by the first chamber support unit 270 and the second process chamber 300 is supported by the second chamber support unit 370. In this case, the up-down unit 160 may be disposed in a lower space of the chamber body 110 when the testing unit 140 is down.

Figure 9:
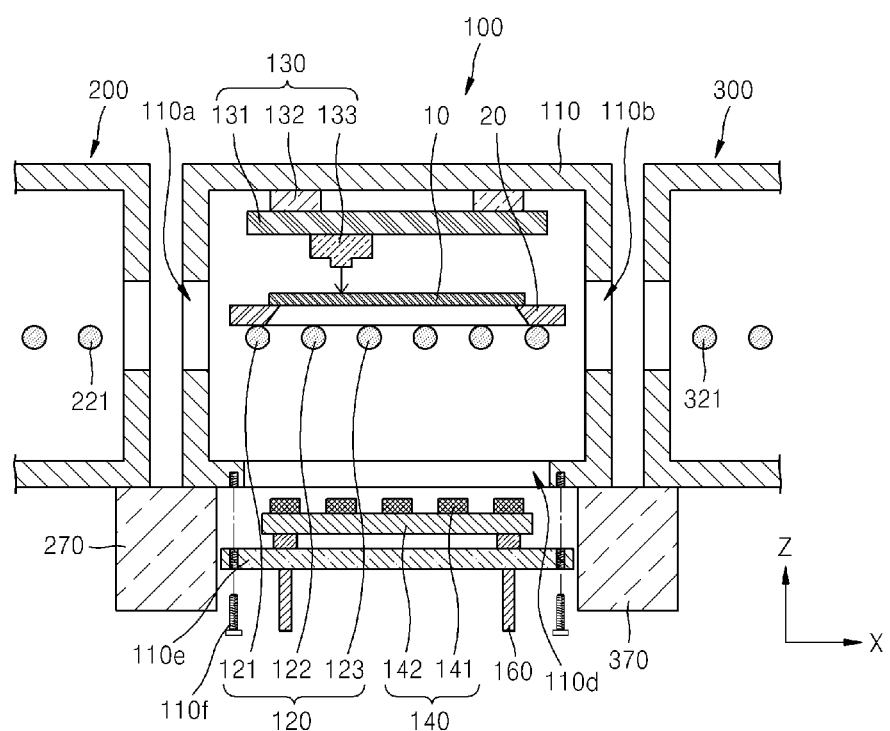
FIG. 9 is a schematic cross-sectional view illustrating a multi-functional apparatus for testing and etching a substrate according to another embodiment of the present invention.

FIG. 9 is a schematic cross-sectional view illustrating the multi-functional apparatus 100 for testing and etching the substrate 10 according to another embodiment of the present invention. In FIG. 8, when the testing unit 140 is moved up, the lower opening 110d of the chamber body 110 is shielded by the plate 142 of the testing unit 140. In the multi-functional apparatus 100 for testing and etching the substrate 10 according to the present embodiment, the up-down unit 160 may also move up and down a shield plate 110e in which the testing unit 140 is installed, and the lower opening 110d of the chamber body 110 is shielded by the shield plate 110e when the shield plate 110e is moved up. As a result, the up-down unit 160 may move the testing unit 140 up and down through the lower opening 110d in such a manner that the testing unit 140 may be disposed inside or outside of the chamber body 110. The testing unit 140 is moved up by the up-down unit 160 and disposed inside of the chamber body 110 to test the substrate 10.

In this case, to make sure of the shielding, an engagement element 110f such as a screw may be used to couple the shield plate 110e and the chamber body 110. An elastic member such as rubber may be disposed between the shield plate 110e and the chamber body 110 so as to separate the inside and outside of the chamber body 110.

Also, in this case, the chamber body 110 may further include an additional up-down unit that moves the testing unit 140 up and down from the shield plate 110e, and thus various modifications may be possible.

Figure 10:
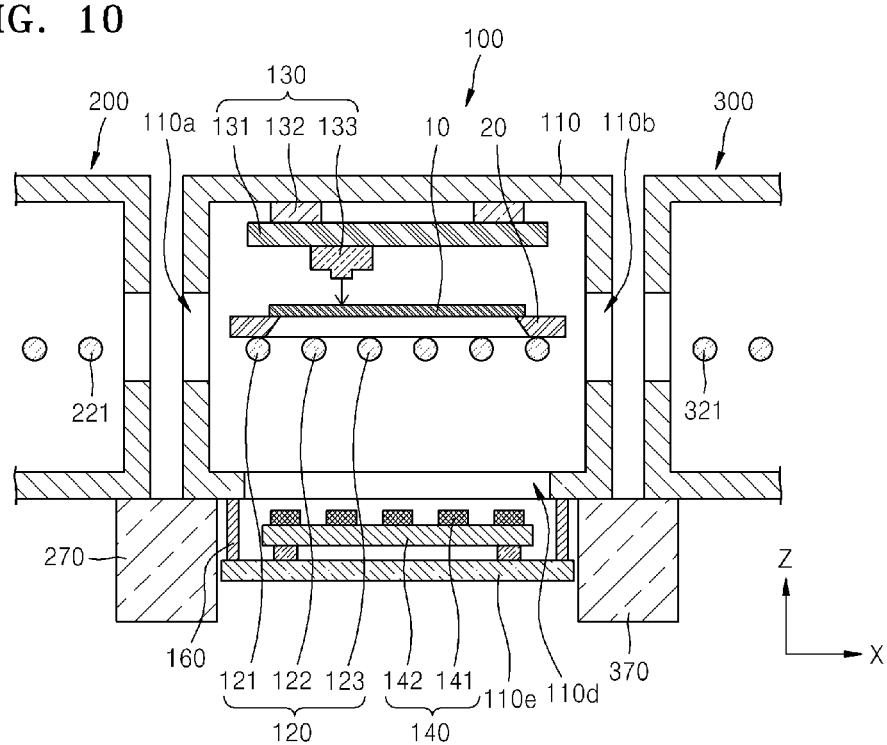
FIG. 10 is a schematic cross-sectional view illustrating a multi-functional apparatus for testing and etching a substrate according to another embodiment of the present invention.

FIG. 10 is a schematic cross-sectional view illustrating the multi-functional apparatus 100 for testing and etching the substrate 10 according to another embodiment of the present invention. The multi-functional apparatus 100 for testing and etching the substrate 10 according to the present embodiment may install the up-down unit 160 in the chamber body 110 to move the shield plate 110e up and down. Such an up-down unit 160 may include, for example, a rotation axis having a thread on a circumferential surface thereof and a motor that rotates the rotation axis in a forward direction or in a backward direction. The shield plate 110e may include a through hole (into which the rotation axis passes) and a thread in an inner surface thereof.

Figure 11:
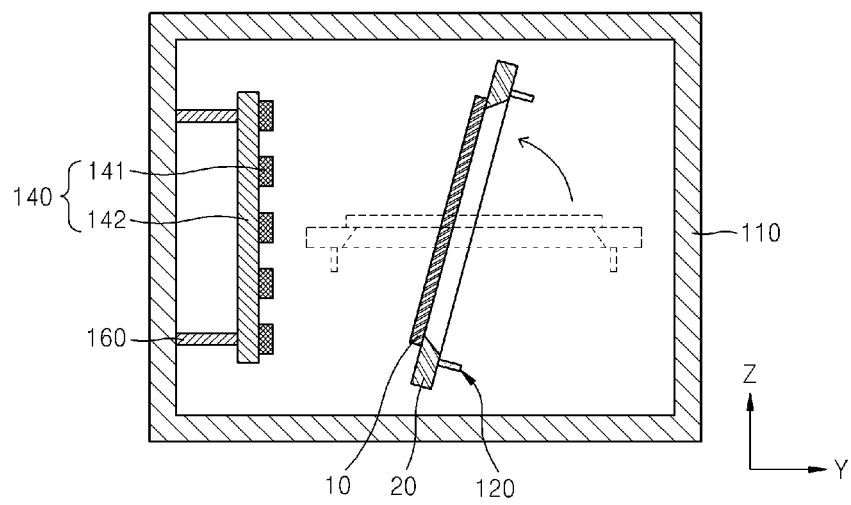
FIG. 11 is a schematic cross-sectional view for explaining operations of a testing unit and a transfer unit of a multi-functional apparatus for testing and etching the substrate according to another embodiment of the present invention.

FIG. 11 is a schematic cross-sectional view for explaining operations of a testing unit and a transfer unit of the multi-functional apparatus 100 for testing and etching the substrate 10, according to another embodiment of the present invention.

Referring to FIG. 11, the multi-functional apparatus 100 for testing and etching the substrate 10 according to the present embodiment further includes a rotation unit (not shown) that rotates the substrate 10 disposed on the transfer unit 120 to face a side surface of the chamber body 110. In addition, the testing unit 140 may be disposed by the on the side surface to face the transfer unit in a direction (−y direction or +y direction) so as to test the rotated substrate 10 along another direction (−z direction). In this case, the testing unit 140 may be moved up in a direction (+y direction) toward a center portion of the chamber body 110 or may be moved down in the opposite direction (−y direction) to the direction (+y direction) by the up-down unit 160 disposed in an inward side surface of the chamber body 110.

The rotation unit may rotate only the carrier 20 to which the substrate 10 is fixed by using a clamp or, as shown in FIG. 11, may rotate the carrier 20 and the transfer unit 120. In the latter, for example, as described with reference to FIG. 4, the transfer unit 120 may include the rail 127 and the carrier 20 in which the substrate 10 is seated may include the wheels 121' and 122'.

Here, the transfer unit 120, as shown in FIG. 3, may include wheels 121, 122, and 123 that are rotatably mounted in the transfer frames 125 disposed at both sides thereof. In this case, in a case where the testing unit 140 disposed in a lower portion of the transfer unit 120 tests an emission state of an organic light-emitting display apparatus, the organic light-emitting display apparatus may be partially shielded by an axis connecting the wheels 121, 122, and 123. Thus, the substrate 10 or the carrier 20 to which the substrate 10 is fixed by using the clamp rotates, for example, 90 degrees with respect to an x axis by the rotation unit (not shown), and thus the entire surface may be tested by the testing unit 140 disposed at (on) the inward side surface of the chamber body 110.

Although the multi-functional apparatus 100 for testing and etching the substrate 10 is described up to now, the present invention is not limited thereto. For example, as shown in FIG. 1, a substrate processing apparatus including the first process chamber 200, the second process chamber 300, and the multi-functional apparatus 100 for testing and etching the substrate 10 disposed between the first process chamber 200, the second process chamber 300 also belongs to the scope of the present invention. In this regard, the multi-functional apparatus 100 for testing and etching the substrate 10 included in the substrate processing apparatus may be modified in various suitable ways as described above.

Also, various suitable modifications may be possible like a gate, a buffer chamber, or a buffer zone may be disposed between the first process chamber 200 and the multi-functional apparatus 100 for testing and etching the substrate 10 or between the multi-functional apparatus 100 for testing and etching the substrate 10 and the second process chamber 300.

As described above, the one or more embodiments of the present invention provide multi-functional apparatuses for testing and etching a substrate capable of increasing spatial efficiency and manufacturing efficiency by performing testing and etching operations in a same chamber body and substrate processing apparatuses including the same.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for manufacturing an organic light-emitting apparatus, the method comprising:
   injecting a substrate through a chamber body of a multi-functional apparatus for testing and etching the substrate, the chamber body having an entrance in one of its sides and an exit in another one of its sides, wherein the injecting of the substrate into the chamber body is through the entrance of the chamber body;
   transferring the injected substrate in a direction from the entrance to the exit utilizing a transfer unit disposed inside of the chamber body;
   etching a part of the substrate disposed on the transfer unit utilizing a laser etching unit disposed above the transfer unit;
   testing the substrate disposed on the transfer unit utilizing a testing unit; and ejecting the substrate from the chamber body through the exit of the chamber body.

2. The method of claim 1, further comprising rotating the substrate disposed on the transfer unit to face a side surface of the chamber body utilizing a rotation unit; and testing the rotated substrate, wherein the testing unit is disposed next to the transfer unit and configured to test the rotated substrate.

3. The method of claim 1, wherein the inside of the chamber body is maintained in a nitrogen atmosphere.

4. The method of claim 1, wherein the testing unit comprises a plate in which a plurality of holes are formed and testing devices engaged into at least a part of the plurality of holes.

5. The method of claim 4, wherein the testing devices are detachably engaged into at least a part of the plurality of holes.

6. The method of claim 1, wherein the multi-functional apparatus for testing and etching the substrate is configured to manufacture a bottom emission display apparatus.

7. The method of claim 6, wherein the transfer unit is configured to contact and transfer the substrate through which light is to pass, and the substrate is an element of the bottom emission display apparatus.

8. The method of claim 1, wherein the laser etching unit comprises:

a laser beam irradiation unit for irradiating a laser beam onto the substrate;

a guiding unit configured to guide the laser beam ejected from the laser beam irradiation unit onto the substrate;

a first conveyer unit for conveying the guiding unit in the direction from the entrance to the exit or in an opposite direction to the direction; and a second conveyer unit for conveying the guiding unit in a direction crossing the direction from the entrance to the exit.

9. The method of claim 8, wherein one of the first conveyer unit and the second conveyer unit is configured to be conveyed by the other one of the first conveyer unit and the second conveyer unit, along with the guiding unit.

10. The method of claim 8, wherein a relative location of the laser beam irradiation unit with respect to the chamber body is fixed.

11. The method of claim 1, wherein the laser etching unit comprises:

a laser beam irradiation unit for irradiating a laser beam onto the substrate;

a first conveyer unit for conveying the laser beam irradiation unit in the direction from the entrance to the exit or in an opposite direction to the direction; and a second conveyer unit for conveying the laser beam irradiation unit in a direction crossing the direction from the entrance to the exit.

12. The method of claim 11, wherein one of the first conveyer unit and the second conveyer unit is configured to be conveyed by the other one of the first conveyer unit and the second conveyer unit, along with the laser beam irradiation unit.

13. The method of claim 11, further comprising supporting the laser etching unit from the outside of the chamber body utilizing an etching unit support unit, wherein the chamber body has an upper opening formed in an upper portion thereof and comprises a transmission window that shields the upper opening, and wherein the laser beam irradiation unit is configured to irradiate the laser beam onto the substrate through the transmission window.

14. The method of claim 13, wherein the etching unit support unit is configured not to contact the chamber body.

15. The method of claim 1, wherein the testing unit is disposed under the transfer unit.

16. The method of claim 15, wherein the chamber body has a lower opening in a lower portion thereof.

17. The method of claim 16, further comprising moving the testing unit up by an up-down unit to be disposed adjacent to the lower opening of the chamber body prior to the testing of the substrate.

18. The method of claim 17, wherein, during the moving up of the testing unit by the up-down unit, the testing unit shields the lower opening of the chamber body.

19. The method of claim 16, further comprising moving the testing unit up and down through the lower opening utilizing an up-down unit in such a manner that the testing unit is disposed inside or outside of the chamber body.

20. The method of claim 19, wherein the testing unit is configured to be moved up by the up-down unit to be disposed inside of the chamber body, and to test the substrate.

* * * * *